(12) United States Patent
Guo (10) Patent No.: US 10,459,271 B2
(45) Date of Patent: Oct. 29, 2019

(54) DISPLAY SUBSTATE, MOTHER SUBSTRATE FOR MAKING THE SAME, AND FABRICATING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 210 days.

(21) Appl. No.: 15/116,199

(22) PCT Filed: Feb. 22, 2016

(86) PCT No.: PCT/CN2016/074220
§ 371 (c)(1),
(2) Date: Aug. 2, 2016

(87) PCT Pub. No.: WO2017/020579
PCT Pub. Date: Feb. 9, 2017

(65) Prior Publication Data
US 2017/0192294 A1    Jul. 6, 2017

(30) Foreign Application Priority Data

Jul. 31, 2015 (CN) .......................... 2015 1 0464153

(51) Int. Cl.
*G02F 1/1333* (2006.01)
*G02F 1/136* (2006.01)
(Continued)

(52) U.S. Cl.
CPC ........ *G02F 1/133351* (2013.01); *G02F 1/136* (2013.01); *G03F 7/40* (2013.01);
(Continued)

(58) Field of Classification Search
None
See application file for complete search history.

(56) References Cited

U.S. PATENT DOCUMENTS

| 7,038,740 B1* | 5/2006 | Katsuya | ............ G02F 1/133502 349/139 |
| 2002/0063833 A1* | 5/2002 | Yoo | ................... G02F 1/133707 349/129 |

(Continued)

FOREIGN PATENT DOCUMENTS

| CN | 101266351 A | 9/2008 |
| CN | 102176128 A | 9/2011 |

(Continued)

OTHER PUBLICATIONS

International Search Report & Written Opinion dated May 17, 2016 regarding PCT/CN2016/074220.

(Continued)

*Primary Examiner* — Edward J Glick
*Assistant Examiner* — David Y Chung
(74) *Attorney, Agent, or Firm* — Intellectual Valley Law, P.C.

(57) ABSTRACT

The present application discloses a mother substrate comprising a first region comprising a plurality of display substrate units; and a second region; the first region comprises a buffer layer on and in contact with a base substrate, the second region comprises a mat layer on and in contact with the base substrate for reducing segment difference between the first region and the second region.

17 Claims, 5 Drawing Sheets

(51) Int. Cl.
  *G03F 7/40*     (2006.01)
  *H01L 21/78*    (2006.01)
  *H01L 27/12*    (2006.01)
  *G02F 1/1362*   (2006.01)
  *H01L 21/77*    (2017.01)
(52) U.S. Cl.
  CPC .......... *H01L 21/78* (2013.01); *H01L 27/1218* (2013.01); *G02F 1/1362* (2013.01); *G02F 2201/07* (2013.01); *H01L 2021/775* (2013.01)

(56) References Cited

U.S. PATENT DOCUMENTS

| | | | | |
|---|---|---|---|---|
| 2006/0152668 A1* | 7/2006 | Jang | ................ | G02F 1/1339 349/156 |
| 2008/0158482 A1* | 7/2008 | Jang | ................ | C03B 33/033 349/73 |
| 2009/0046235 A1* | 2/2009 | Onishi | ............ | G02F 1/133351 349/153 |
| 2009/0251646 A1* | 10/2009 | Yoo | ................ | G02F 1/133555 349/106 |
| 2010/0045921 A1* | 2/2010 | Wang | ............... | G02F 1/133351 349/153 |
| 2010/0134730 A1* | 6/2010 | Wu | ................ | G02F 1/133784 349/110 |
| 2014/0117342 A1 | 5/2014 | Kwon et al. | | |
| 2014/0152916 A1* | 6/2014 | Nakamura | ............ | G06F 3/044 349/12 |

FOREIGN PATENT DOCUMENTS

CN     103779356 A    5/2014
JP     20087360 A     1/2008

OTHER PUBLICATIONS

First Office Action in the Chinese Patent Application No. 201510464153.6, dated Jul. 3, 2017; English translation attached.

\* cited by examiner

DISPLAY SUBSTATE, MOTHER SUBSTRATE FOR MAKING THE SAME, AND FABRICATING METHOD THEREOF

CROSS-REFERENCE TO RELATED APPLICATION

This application is a national stage application under 35 U.S.C. § 371 of International Application No. PCT/CN2016/074220 filed Feb. 22, 2016, which claims priority to Chinese Patent Application No. 201510464153.6, filed Jul. 31, 2015, the contents of which are incorporated by reference in the entirety.

TECHNICAL FIELD

The present invention relates to display technology, more particularly, to an array substrate, a mother substrate for making the same, and a fabricating method thereof.

BACKGROUND

Liquid crystal display devices have found a wide range of applications in display technology field. Typically, liquid crystal display devices include an array substrate and a package substrate (e.g., a color filter substrate) packaged together. The array substrate and the package substrate are fabricated separately, then assembled to produce a display panel. For efficiency consideration, production of the array substrate and the package substrate utilizes a mother substrate. Specifically, a plurality of array substrate units (or package substrate units) are formed on a single mother substrate. The mother substrate having the plurality of array substrate units and the mother substrate having the plurality of package substrate units are packaged together, thereby forming a mother substrate having a plurality of display panel units. The mother substrate having the plurality of display panel units is subsequently cut to obtain a plurality of display panels.

SUMMARY

In one aspect, the present disclosure provides a mother substrate comprising a first region comprising a plurality of display substrate units; and a second region. The first region comprises a buffer layer on and in contact with a base substrate, the second region comprises a mat layer on and in contact with the base substrate for reducing segment difference between the first region and the second region.

Optionally, a maximum thickness of the mat layer is h1, and the thickness of the buffer layer is h2, h1<h2.

Optionally, $0.6 \le h1/h2 \le 0.9$.

Optionally, the second region comprises a plurality of rows and a plurality of columns intersecting each other forming a plurality of intersection sections, the plurality of rows and the plurality of columns dividing the mother substrate into the plurality of display substrate units; the mat layer is within the plurality of intersection sections.

Optionally, the mat layer covers the plurality of intersection sections.

Optionally, the mat layer has a uniform thickness.

Optionally, the mat layer comprises an array of a plurality of mat units.

Optionally, the plurality of mat units have a substantially the same shape, and a trapezoidal cross-section along a direction perpendicular to the base substrate.

Optionally, the buffer layer and the mat layer are made of a same resin material.

Optionally, a maximum thickness of the mat layer is h1, and the thickness of the buffer layer is h2, h1=h2, the mat layer abuts a side plane of the buffer layer at the interface between the first region and the second region, the mat layer has a right triangular cross-section along a direction perpendicular to the base substrate.

Optionally, the mat layer comprises a bottom plane and an inclined side plane distal to a side plane of the buffer layer, the inclined side plane and the bottom plane defines an angle α, and $20° \le \alpha \le 60°$.

Optionally, the second region comprises a plurality of rows and a plurality of columns intersecting each other forming a plurality of intersection sections, the plurality of rows and the plurality of columns dividing the mother substrate into the plurality of display substrate units; the mat layer is within the plurality of intersection sections.

Optionally, the plurality of display substrate units are a plurality of array substrate units.

In another aspect, the present disclosure provides a method of fabricating a mother substrate comprising a first region and a second region, the method comprising patterning a first material layer to form the mat layer, wherein the first region comprising a buffer layer on and in contact with a base substrate the second region comprising a mat layer on and in contact with the base substrate for reducing segment difference between the first region and the second region.

Optionally, the patterning step comprises forming a photoresist layer on a side of the first material layer distal to the base substrate; exposing the photoresist layer with a mask plate comprising a sub-resolution feature corresponding to the mat layer; developing the exposed photoresist layer to obtain a photoresist pattern including a first section comprising a portion corresponding to the mat layer, and a second section corresponding to remaining portion of the photoresist layer; removing the photoresist layer in the second section; and etching the first material layer in the second section.

Optionally, the sub-resolution feature has a rectangular or round shape.

In another aspect, the present disclosure provides a display substrate comprising a display region comprising a buffer layer; and a peripheral region. At least a corner portion of the peripheral region comprises a mat layer; the buffer layer and the mat layer are in contact with a base substrate.

Optionally, a maximum thickness of the mat layer is h1, and the thickness of the buffer layer is h2, h1<h2.

Optionally, $0.6 \le h1/h2 \le 0.9$.

Optionally, the mat layer is within one or more corner portions of the peripheral region.

Optionally, the mat layer covers the one or more corner portions.

Optionally, the mat layer has a uniform thickness.

Optionally, the mat layer comprises an array of a plurality of mat units.

Optionally, the plurality of mat units have a substantially the same shape, and a trapezoidal cross-section along a direction perpendicular to the base substrate.

Optionally, the buffer layer and the mat layer are made of a same resin material.

Optionally, a maximum thickness of the mat layer is h1, and the thickness of the buffer layer is h2, h1=h2, the mat layer abuts a side plane of the buffer layer at the interface between the display region and the peripheral region, the mat layer has a right triangular cross-section along a direction perpendicular to the base substrate.

Optionally, the mat layer comprises a bottom plane and an inclined side plane distal to a side plane of the buffer layer, the inclined side plane and the bottom plane defines an angle α, and $20° \leq \alpha \leq 60°$.

Optionally, the mat layer is within one or more corner portions of the peripheral region.

Optionally, the display substrate is an array substrate.

In another aspect, the present disclosure provides a display panel comprising a display substrate described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In a conventional method of forming a mother substrate having the array substrate units, typically a buffer layer is formed on the base substrate for planarization purpose and achieving a lower power consumption. Typically, the buffer layer is made of a resin material. Subsequently, other layers of the array substrate units are patterned on the buffer layer. For example, the patterning process may include substrate cleaning, film forming, photoresist application, exposure, developing, etching, photoresist removal, and so on.

In the conventional method of forming the mother substrate having the array substrate units, the photoresist is applied to the entire mother substrate, followed by spinning the mother substrate to evenly distribute the photoresist material on the mother substrate.

A conventional mother substrate having the array substrate units includes an array substrate unit regions which contains a plurality of array substrate units or on which the plurality of array substrate units are to be formed, and a cutting region. After the mother substrate having the array substrate units is assembled together with the mother substrate having the package substrate units to form a mother substrate having the display panel units, the mother substrate having the display panel units is cut within the cutting region to form the plurality of display panels.

After forming the buffer layer on the mother substrate on which the plurality of array substrate units are to be formed, the buffer layer within the cutting region is removed for facilitating subsequent manufacture procedures. If the buffer layer within the cutting region is not removed, additional manufacturing devices are required during subsequent manufacture procedures (e.g., patterning procedures), making the manufacturing process unduly complicated. The absence of the buffer layer within the cutting region creates a large segment difference between the array substrate unit region and the cutting region.

Figure 1:
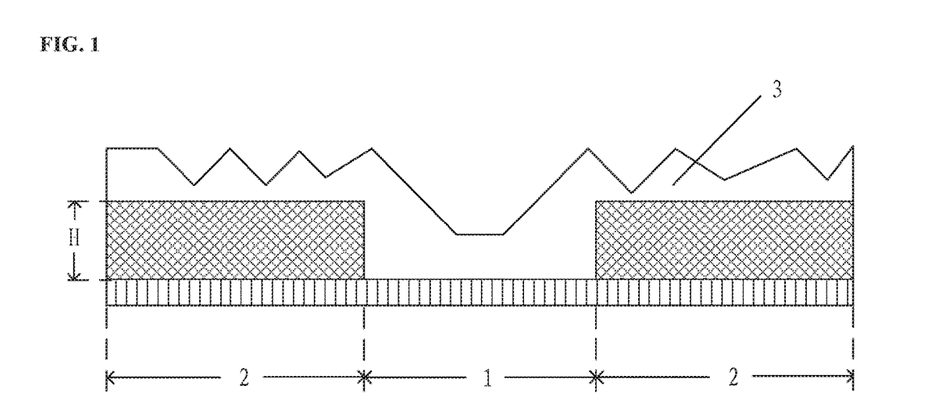
FIG. 1 is a diagram illustrating the structure of a conventional mother substrate.

FIG. 1 is a diagram illustrating the structure of a conventional mother substrate. Referring to FIG. 1, when the photoresist material 3 is applied and span on the mother substrate, the presence of this large segment difference H between the array substrate unit region 2 and the cutting region 1 results in an extremely uneven distribution of the photoresist material 3 and an extremely uneven surface in the array substrate unit region 2 proximal to the cutting region 1. The uneven surface of the photoresist material 3 within the array substrate unit region 2 affects the photoresist coating and the formation of critical dimension features in the subsequent exposure and development steps.

The present disclosure provides a superior mother substrate for making array substrates, packages substrates and display panels. In one aspect, the present disclosure provides a mother substrate including a first region (i.e., a display substrate unit region) having a plurality of display substrate units, and a second region (i.e., a cutting region) having a mat layer for reducing segment difference between the first region (i.e., the display substrate unit region) and the second region (i.e., the cutting region). As used herein, the term "display substrate" refers to either an array substrate or a package substrate (e.g., a color filter substrate). Similarly, the term display substrate unit may be an array substrate unit or a package substrate unit. Optionally, the first region includes a buffer layer on and in contact with the base substrate. Optionally, the second region includes a mat layer on and in contact with the base substrate. Optionally, the second region does not include a buffer layer.

In some embodiments, the mother substrate includes an array substrate unit region (i.e., the first region) having a plurality of array substrate units, and a cutting region (i.e., the second region) having a mat layer for reducing segment difference between the array substrate unit region and the cutting region. For example, the array substrate unit includes a buffer layer on a base substrate, the mat layer in the cutting region reduces the segment difference between the array substrate unit region and the cutting region, e.g., the segment difference between the buffer layer and the cutting region.

In some mother substrates, the array substrate unit region further includes one or more components of an array substrate. For example, an array substrate unit region may include a thin film transistor (e.g., a gate electrode, a source electrode, a drain electrode, a gate insulating layer). An array substrate unit region for a liquid crystal display panel may include a pixel electrode and/or a liquid crystal layer, etc. An array substrate unit region for an organic light emitting device may further include one or more of a light emitting layer, a hole injection layer, an electrode injection layer, a hole transport layer, and/or an electron transport layer, etc.

In some embodiments, the mother substrate includes a package substrate unit region having a plurality of package substrate units (e.g., color filter substrate units), and a cutting region having a mat layer for reducing segment difference between the package substrate unit region and the cutting region. For example, the package substrate unit includes a buffer layer on a base substrate, the mat layer in the cutting region reduces the segment difference between the package substrate unit region and the cutting region, e.g., the segment difference between the buffer layer and the cutting region.

In some embodiments, the package substrate unit region further includes one or more components of a package substrate, e.g., a black matrix, a color filter, a touch electrode layer, etc.

In some mother substrate, the buffer layer and the mat layer are both in contact with the base substrate. A maximum thickness of the mat layer is h1, and the thickness of the buffer layer is h2. Optionally, h1=h2. Optionally, h1<h2. Optionally, $0.6 \leq h1/h2 \leq 0.9$, e.g., $0.6 \leq h1/h2 \leq 0.7$, $0.7 \leq h1/h2 \leq 0.8$, or $0.8 \leq h1/h2 \leq 0.9$. Optionally, the buffer layer and the mat layer are made of a same material (e.g., a resin material). Optionally, the buffer layer and the mat layer are made of different material. Optionally, the buffer layer and/or the mat layer are made of a non-photoresist material.

In some embodiments, the mat layer is formed throughout the entire cutting region. For example, the mat layer covers the entire cutting region of the mother substrate. In some embodiments, the cutting region includes a plurality of rows (cutting rows) and a plurality of columns (cutting columns) intersecting each other forming a plurality of intersection sections. The plurality of rows and the plurality of columns divides the mother substrate into the plurality of array substrate units. The mat layer is within (e.g., limited to) the plurality of intersection sections.

The mat layer may be an integral single layer covering the intersection sections or the entire cutting region. Optionally, the mat layer has a uniform thickness. Alternatively, the mat layer may include a plurality of mat units, e.g., an array of a plurality of mat units. Optionally, the mat layer includes a plurality of substantially uniform mat units, e.g., a plurality of mat units having a substantially the same shape or a substantially the same thickness. Optionally, the plurality of mat units have a trapezoidal cross-section along a direction perpendicular to the base substrate. Optionally, the mat layer includes a plurality of non-uniform mat units, e.g., a plurality of mat units having different thicknesses or shapes. The mat units may be separated from each other.

In some mother substrates, the mat layer abuts a side plane of the buffer layer at the interface between the array substrate unit region and the cutting region. Optionally, the mat layer has a right triangular cross-section along a direction perpendicular to the base substrate. Optionally, h1=h2. In some mother substrates, the mat layer comprises a bottom plane and an inclined side plane distal to a side plane of the buffer layer, the inclined side plane and the bottom plane defines an angle α, and $20° \leq \alpha \leq 60°$. Optionally, the mat layer is within (e.g., limited to) the plurality of intersection sections.

After the plurality of array substrate units are formed on a mother substrate and the plurality of package substrate units are formed on another mother substrate, two mother substrates are packaged together to form a mother substrate having a plurality of display panel units, which is then cut to obtain a plurality of display panels.

In another aspect, the present disclosure provides an array substrate having a display region and a peripheral region, at least a corner portion of the peripheral region includes a mat layer. In another aspect, the present disclosure provides a package substrate having a display region and a peripheral region, at least a corner portion of the peripheral region includes a mat layer. Optionally, the mat layer is formed throughout the entire peripheral region. As used herein, the term "array substrate" refers to an array substrate in a display panel after the mother substrate is cut, or an array substrate in a precut mother substrate. In a precut mother substrate, the display region of the array substrate corresponds to the array substrate unit region of the precut mother substrate, the peripheral region of the array substrate corresponds to a portion of the cutting region of the precut mother substrate. Similarly, the term "package substrate" as used herein refers to a package substrate in a display panel after the mother substrate is cut, or a package substrate in a precut mother substrate. In a precut mother substrate, the display region of the package substrate corresponds to the package substrate unit region of the precut mother substrate, the peripheral region of the package substrate corresponds to a portion of the cutting region of the precut mother substrate.

In some embodiments, the display region of the array substrate or the package substrate includes a buffer layer. In some mother substrate, the buffer layer and the mat layer are both in contact with a base substrate. A maximum thickness of the mat layer is h1, and the thickness of the buffer layer is h2. Optionally, h1=h2. Optionally, h1<h2. Optionally, $0.6 \leq h1/h2 \leq 0.9$, e.g., $0.6 \leq h1/h2 \leq 0.7$, $0.7 \leq h1/h2 \leq 0.8$, or $0.8 \leq h1/h2 \leq 0.9$. Optionally, the buffer layer and the mat layer are made of a same material (e.g., a resin material). Optionally, the buffer layer and the mat layer are made of different material.

In some embodiments, the mat layer is formed throughout the entire peripheral region. For example, the mat layer covers the entire peripheral region of the array substrate or the package substrate. In some embodiments, the mat layer is within (e.g., limited to) one or more corner portions (e.g., four corner portions) of the peripheral region.

The mat layer may be an integral single layer covering the corner portions or the entire peripheral region. Optionally, the mat layer has a uniform thickness. Alternatively, the mat layer may include a plurality of mat units, e.g., an array of a plurality of mat units. Optionally, the mat layer includes a plurality of substantially uniform mat units, e.g., a plurality of mat units having a substantially the same shape or a substantially the same thickness. Optionally, the plurality of mat units have a trapezoidal cross-section along a direction perpendicular to the base substrate. Optionally, the mat layer includes a plurality of non-uniform mat units, e.g., a plurality of mat units having different thicknesses or shapes. The mat units may be separated from each other.

In some mother substrates, the mat layer abuts a side plane of the buffer layer at the interface between the display region and the peripheral region. Optionally, the mat layer has a right triangular cross-section along a direction perpendicular to the base substrate. Optionally, h1=h2. In some mother substrates, the mat layer comprises a bottom plane and an inclined side plane distal to a side plane of the buffer layer, the inclined side plane and the bottom plane defines an angle α, and $20° \leq \alpha \leq 60°$. Optionally, the mat layer is within (e.g., limited to) the plurality of intersection sections.

In some mother substrates, the array substrate unit region further includes one or more components of an array substrate. For example, an array substrate unit region may include a thin film transistor (e.g., a gate electrode, a source electrode, a drain electrode, a gate insulating layer). An array substrate unit region for a liquid crystal display panel may include a pixel electrode and/or a liquid crystal layer, etc. An array substrate unit region for an organic light emitting device may further include one or more of a light emitting layer, a hole injection layer, an electrode injection layer, a hole transport layer, and/or an electron transport layer, etc.

In some embodiments, the package substrate further includes one or more components, e.g., a black matrix, a color filter, a touch electrode layer, etc.

In another aspect, the present disclosure provides a display panel having an array substrate described herein.

Figure 2:
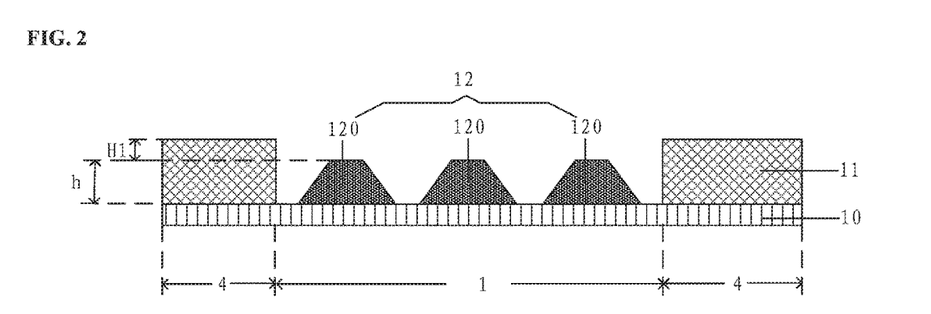
FIG. 2 is a diagram illustrating the structure of a mother substrate in some embodiments.
Figure 3:
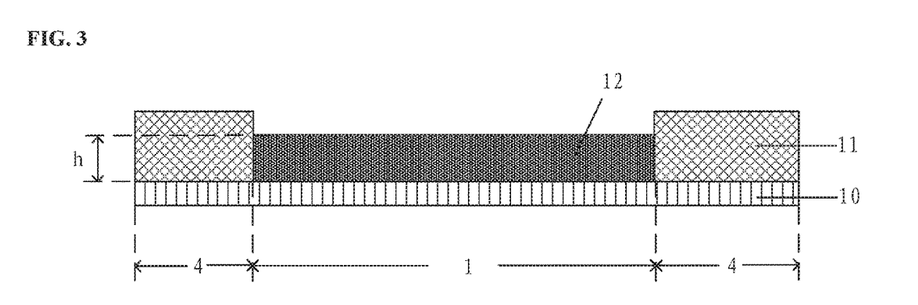
FIG. 3 is a diagram illustrating the structure of a mother substrate in some embodiments.

FIGS. 2-5 are diagrams illustrating the structure of several mother substrates in some embodiments. Referring to FIG. 2, the mother substrate in the embodiment includes an array substrate unit region 4 and a cutting region 1. The cutting region 1 includes a mat layer 12 having one or more mat units 120 for reducing the segment difference between the array substrate unit region 4 and the cutting region 1.

Various embodiments of mat layer and mat units may be practiced. For example, the mat layer 12 may include a plurality of mat units (FIG. 2) or an integral single unit (FIG. 3), or one or more mat units which extend from the buffer layer 11 into the cutting region 1 by a certain length sufficient to reduce the segment difference at the interface of the array substrate unit region 4 and the cutting region 1 (FIG. 4; e.g., forming a gradual slope between the array substrate unit region 4 and the cutting region 1).

Figure 4:
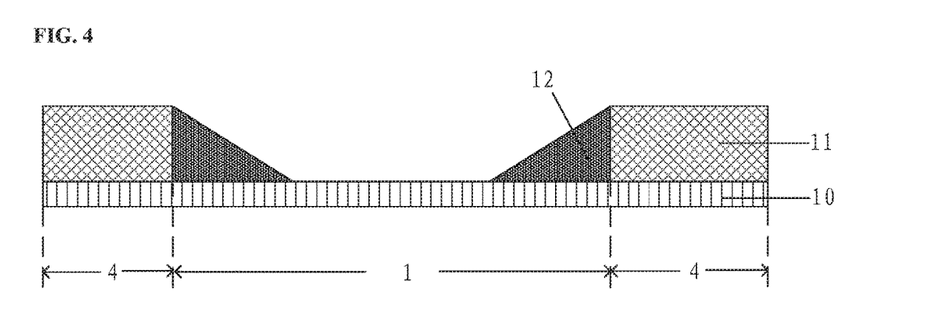
FIG. 4 is a diagram illustrating the structure of a mother substrate in some embodiments.

FIG. 4 is a diagram illustrating the structure of a mother substrate in some embodiments. Referring to FIG. 4, the mother substrate in the embodiment includes a buffer layer 11 within the array substrate unit region 4, and a mat layer 12 within the cutting region 1. The buffer layer 11 and the mat layer 12 in the embodiment is on and in contact with the base substrate 10. The mat layer 12 in the embodiment includes two mat units. One side of each mat unit abuts, and has a same thickness as, a side of the buffer layer 11. Each mat unit extends from the abutting side into the cutting region 1 by a certain length sufficient to reduce the segment difference between the array substrate unit region 4 and the cutting region 1. The thickness of the mat unit decreases gradually over the certain length (e.g., toward the center of the cutting region 1). The mat unit may have a cross-section of any shape as long as the shape sufficiently provides a gradual slope between the array substrate unit region 4 and the cutting region 1. For example, the cross-section may have a triangle shape (as shown in FIG. 4), or a right trapezoid shape. Optionally, the thickness of the mat layer 12 in the center of the cutting region 1 is zero. Optionally, the thickness of the mat layer 12 in the center of the cutting region 1 has a value larger than zero. Optionally, the top side of the cross-section is a substantially straight line. Optionally, the top side of the cross-section is a curve, e.g., a parabolic curve. Numerous alternative embodiments of the mat unit may be practiced to form a mat unit having various shapes and dimensions.

As used herein, the term "segment difference" refers to the height difference between the array substrate unit region 4 and the cutting region 1. For example, as shown in FIG. 2, the segment difference H1 is the height difference between the buffer layer 11 in the array substrate unit region 4 and the mat layer 12 within the cutting region 1.

The mother substrate according to the present disclosure includes an array substrate unit region and a cutting region. The cutting region includes a mat layer for reducing the segment difference between the array substrate unit region and the cutting region. The extremely uneven distribution of the photoresist material and the extremely uneven surface in the array substrate unit region proximal to the cutting region caused by a large segment difference can be eliminated or alleviated by the inclusion of the mat layer. Accordingly, the issues associated with subsequent exposure and development steps (e.g., affected photoresist coating and formation of critical dimension features) can also be avoided or improved.

High-resolution display devices have a very dense wiring design which increases power consumption of the display devices. Typically, a buffer layer is formed on the base substrate to increase the capacity between the wires and lower power consumption. To facilitate subsequent manufacture procedures (e.g., cutting), typically only the array substrate unit region but not the cutting region includes a buffer layer. Due to the relatively large thickness of the buffer layer, the absence of the buffer layer within the cutting region creates a large segment difference between the array substrate unit region and the cutting region, affecting the subsequent photoresist coating. Referring to FIG. 2, the present mother substrate further includes a base substrate 10. The array substrate unit region 4 includes a buffer layer 11. The mat layer 12 is on the base substrate 10.

Various embodiments may be practiced to fabricate the buffer layer and the mat layer. For example, the buffer layer and the mat layer may be fabricated in a single patterning process or two separate patterning processes. Optionally, the buffer layer and the mat layer is in a same layer. The buffer layer and the mat layer may be made of a same material. Optionally, the buffer layer and the mat layer are made of different material.

The large segment difference may be caused by the presence of a layer other than the buffer layer within the first region (e.g., the array substrate unit region) and the absence thereof within the second region (e.g., the cutting region). For example, the presence of a passivation layer or an insulating layer of a large thickness within the array substrate unit region and the absence thereof within the cutting region may result in a large segment difference between the array substrate unit region and the cutting region. The mat layer according to the present disclosure may be used to compensate the segment difference resulting from any and all layers within the array substrate unit region or an accumulation thereof.

As discussed above, the extremely uneven distribution of the photoresist material and the extremely uneven surface in the array substrate unit region proximal to the cutting region caused by a large segment difference can be eliminated or alleviated by the inclusion of the mat layer. Accordingly, the issues associated with subsequent exposure and development steps (e.g., affected photoresist coating and formation of critical dimension features) can also be avoided or improved.

Optionally, the buffer layer 11 is in contact with the base substrate 10. Optionally, the mat layer 12 is in contact with the base substrate 10. Optionally, both the buffer layer 11 and the mat layer are in contact with the base substrate 10.

Various materials may be used for making the buffer layer and/or the mat layer. Optionally, the buffer layer and the mat layer are made of a resin material. Optionally, the buffer layer and the mat layer are made of a same material. Optionally, the buffer layer and the mat layer are made of different materials.

In a mother substrate having a plurality of array substrate units, various layers may be formed on the buffer layer. For example, the mother substrate may further include a gate electrode, a gate insulating layer, a thin film transistor, a pixel electrode within the array substrate unit region. In a mother substrate having a plurality of package substrate units or a mother substrate having a plurality of display panel units, the mother substrate may further include a black matrix, a color filter, etc.

Figure 5:
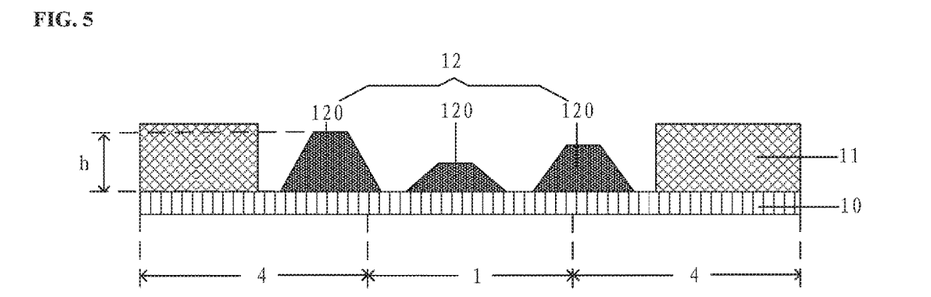
FIG. 5 is a diagram illustrating the structure of a mother substrate in some embodiments.

Optionally, the maximum thickness of the mat layer is less than that of the buffer layer. As used herein the thickness of the mat layer refers to the thickness along a direction perpendicular to the base substrate. In a mat layer having a uniform thickness, the uniform thickness is the maximum thickness. If the thickness of the mat layer is non-uniform, the maximum thickness of the mat layer is the maximum thickness along a direction perpendicular to the base substrate. Referring to FIG. 2, the mat layer 120 in the embodiment includes a plurality of mat units 120 having a uniform thickness. The maximum thickness h of the mat layer is the thickness of the mat unit 120. Referring to FIG. 2, the mat layer 120 in the embodiment includes an integral single unit (a continuous mat layer 120 having a uniform thickness). In this case, the maximum thickness h of the mat layer is the thickness of the mat layer. Referring to FIG. 5, the mat layer 120 in the embodiment includes a plurality of mat units 120 having non-uniform thicknesses. In this case, the maximum thickness h of the mat layer is the thickness of a mat unit 120 having the largest thickness.

In some embodiments, the mat layer has a thickness such that it facilitates the subsequent cutting process and sufficiently reduces the segment difference between the first region (e.g., the array substrate unit region) and the second region (e.g., the cutting region). Optionally, the buffer layer has a thickness of h1, and the mat layer has a thickness of h2. Optionally, $0.6 \leq h1/h2 \leq 0.9$, e.g., $0.6 \leq h1/h2 \leq 0.7$, $0.7 \leq h1/h2 \leq 0.8$, or $0.8 \leq h1/h2 \leq 0.9$.

Figure 6:
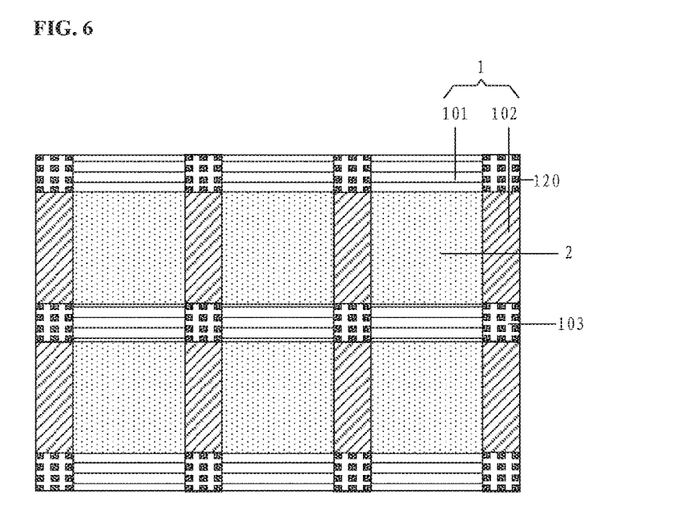
FIG. 6 shows a plan view of a mother substrate in some embodiments.

FIG. 6 shows a plan view of a mother substrate in some embodiments. Referring to FIG. 6, the cutting region in the embodiment includes a plurality of rows 101 and a plurality of columns 102 intersecting each other, dividing the mother substrate into a plurality of array substrate units (or package substrate units or display panel units). Therefore, the cutting region includes an intersection region 103 where a row and a column overlap and a remaining region. The uneven photoresist distribution and uneven surface caused by the segment difference is more severe in the intersection region 103 as compared to the remaining region. In some embodiment, to simplify manufacturing process and facilitate subsequent cutting process, the mat layer is limited to the intersection region 103.

In some embodiments, the mat layer within the intersection region 103 includes one or more mat units 120. Various embodiments of mat unit 120 (e.g., numbers, shape, dimension, etc.) may be practiced. Optionally, the plurality of mat units 120 are separated from each other within the intersection region 103, facilitating the subsequent cutting process.

In some embodiments, the plurality of mat units 120 have a substantially the same shape, and a trapezoidal cross-section along a direction perpendicular to the base substrate 10. This design simplifies mother substrate manufacturing process. By having a trapezoidal cross-section along a direction perpendicular to the base substrate 10, the side plane of the mat unit 120 forms a gradual slope, reducing surface undulation of the photoresist layer. Various embodiments may be practiced to fabricate the mat unit 120. For example, a mask having an array of sub-masks may be utilized for forming a mask pattern. Optionally, the mask has a resolution lower than the resolution of photoresist exposure unit/device. Due to the light scattering effect during the exposure and limited by the photoresist exposure resolution, a plurality of mat units 120 can be formed by exposure, development, etching, etc.

Various shapes may be used for designing the sub-mask. Optionally, the sub-mask has a rectangular shape or round shape.

Figure 7:
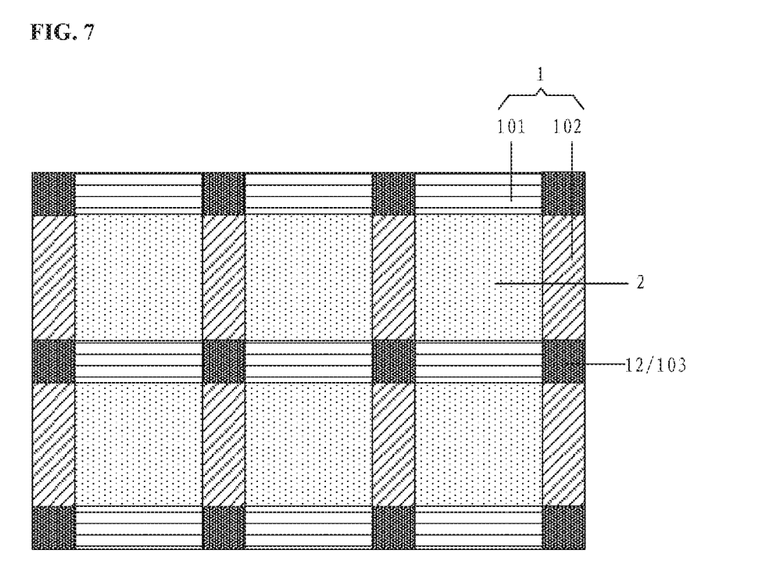
FIG. 7 shows a plan view of a mother substrate in some embodiments.

FIG. 7 shows a plan view of a mother substrate in some embodiments. Referring to FIG. 7, the mat layer 12 in the embodiment includes an integral single mat unit in each intersection region 103. Each integral single mat unit covers each intersection region 103.

Optionally, the mat layer has a uniform thickness.

Optionally, the buffer layer and the mat layer are made of a same resin material. Resin materials have small dielectric constant. In subsequent manufacturing processes, metal wires are formed on the buffer layer. A material having a small dielectric constant such as a resin can reduce the capacity between metal wires, enhancing the transmission rate of metal wires.

Figure 8:
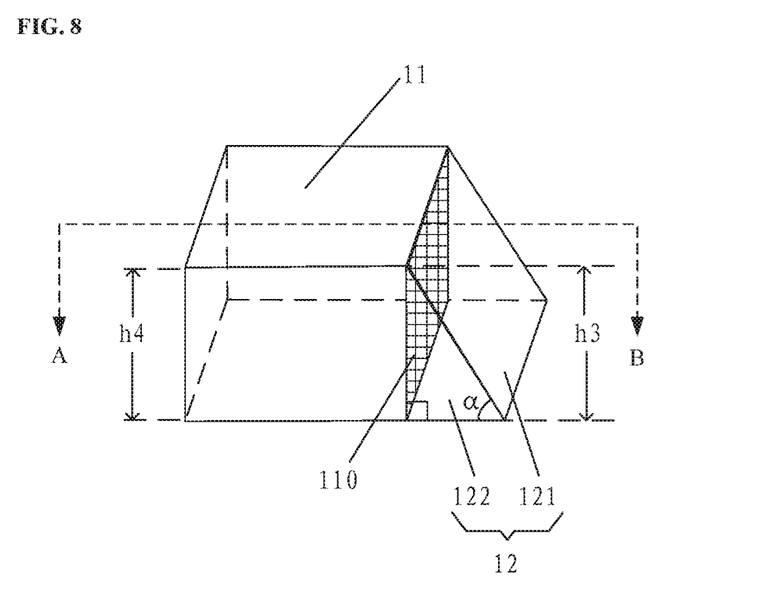
FIG. 8 is a diagram illustrating the structure of a mother substrate in some embodiments.

Optionally, the maximum thickness of the mat layer is substantially the same as the thickness of the buffer layer. Optionally, a mat unit abuts the buffer layer at the interface between the array substrate unit region and the cutting region. Optionally, the cross-section of the mat unit along a direction perpendicular to the base substrate has a right triangular shape.

FIG. 8 is a diagram illustrating the structure of a mother substrate in some embodiments. Referring to FIG. 8, the maximum thickness h3 of the mat layer 12 is substantially the same as the thickness h4 of the buffer layer 11. The cross-section of the mat layer 12 refers to the cross-section along the A-B plane as shown in FIG. 8 (along a direction perpendicular to the base substrate). The mat layer 12 forms a gradual slope abutting a side of the buffer layer at the interface between the array substrate unit region and the cutting region. By having this gradual slope, the segment difference between the array substrate unit region and the cutting region is effectively reduced. The extremely uneven distribution of the photoresist material and the extremely uneven surface in the array substrate unit region proximal to the cutting region caused by a large segment difference can be eliminated or alleviated by the inclusion of the mat layer. Accordingly, the issues associated with subsequent exposure and development steps (e.g., affected photoresist coating and formation of critical dimension features) can also be avoided or improved.

Referring to FIG. 8, the mat layer 12 includes an inclined side plane 121 distal to the side plane 110 of the buffer layer 11, and a bottom plane 122. Optionally, the angle between the inclined side plane 121 and the bottom plane 122 is α. Optionally, $20° \leq α \leq 60°$. This design effectively reduces uneven photoresist distribution and uneven photoresist surface.

Figure 9:
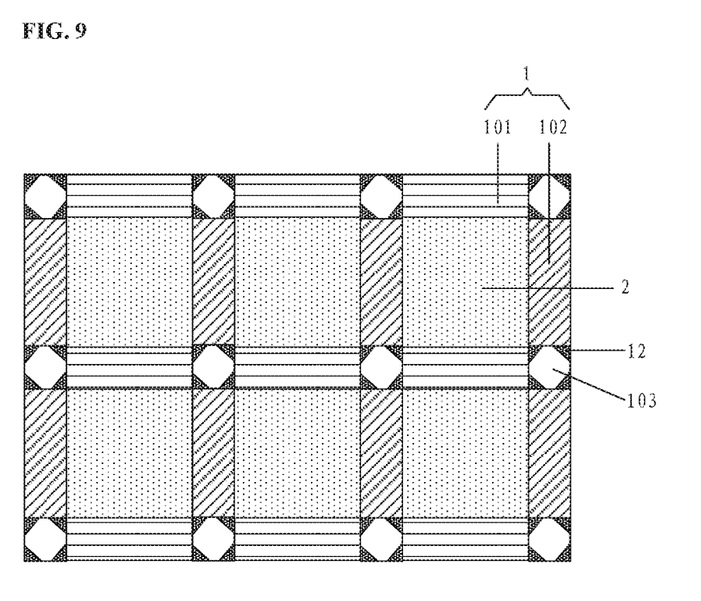
FIG. 9 shows a plan view of a mother substrate in some embodiments.

FIG. 9 shows a plan view of a mother substrate in some embodiments. Referring to FIG. 9, the cutting region 1 in the embodiment includes a plurality of rows 101 and a plurality of columns 102 intersecting each other, dividing the mother substrate into a plurality of array substrate units (or package substrate units or display panel units). The cutting region includes an intersection region 103 where a row and a column overlap and a remaining region. The mat layer in the embodiment is limited to the intersection region 103. The mat layer 12 in the embodiment includes four mat units in each intersection region 103, each of which occupies a corner of the intersection region 103. For example, each mat unit abuts two adjacent sides of a corner. Optionally, each mat unit is a triangular-based pyramid including a triangular base and three side surfaces. Two of the three side surfaces abut two adjacent sides of a corner. The third side surface of the triangular-based pyramid extends from the apex of the triangular-based pyramid into the cutting region 1 by a certain distance sufficient to reduce the segment difference between the array substrate unit region 4 and the cutting region 1. The maximum thickness of the triangular-based pyramid may be substantially the same as or less than the thickness of the buffer layer. The thickness of the mat unit gradually decreases over the certain distance (e.g., toward the center of the cutting region 1). Optionally, the third side surface is a flat surface. Alternatively, the third side surface is a curved surface (e.g., a parabolic surface). Optionally, the thickness of the mat layer 12 in the center of the cutting region 1 is zero. Optionally, the thickness of the mat layer 12 in the center of the cutting region 1 has a value larger than zero. Optionally, the base of the mat unit is a triangle. Optionally, the base of the mat unit is a quarter circle or equivalents thereof. Numerous alternative embodiments of the mat unit may be practiced to form a mat unit having various shapes and dimensions.

Figure 10:
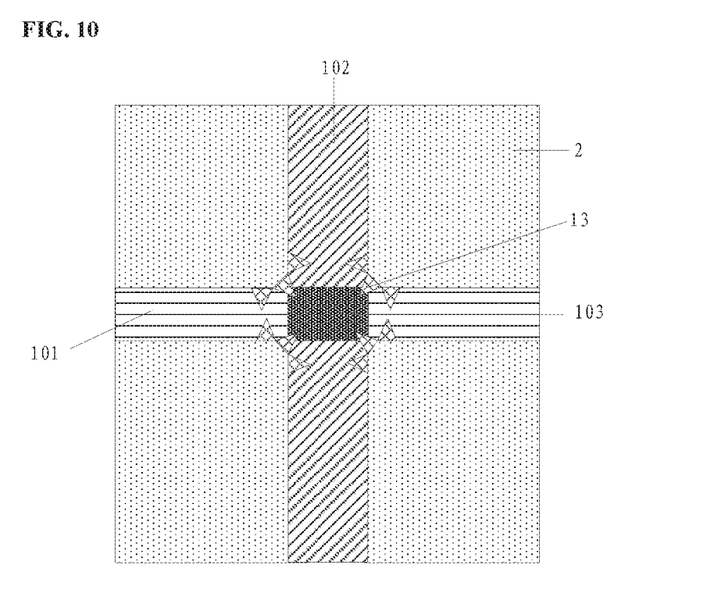
FIG. 10 is a diagram illustrating the structure of a mask in some embodiments.

Various embodiments may be practiced to fabricate the mat layer 12. For example, a mask may be used for patterning the mat layer. FIG. 10 is a diagram illustrating the structure of a mask in some embodiments. Referring to FIG. 10, a mask 13 having serrated shape in the embodiment can be used for patterning the mat layer 12. The mask in the embodiment has a resolution lower than the resolution of the photoresist exposure device. Due to the light scattering effect during the exposure and limited by the photoresist exposure resolution, a mat layer 12 can be formed by exposure, development, etching, etc.

Figure 11:
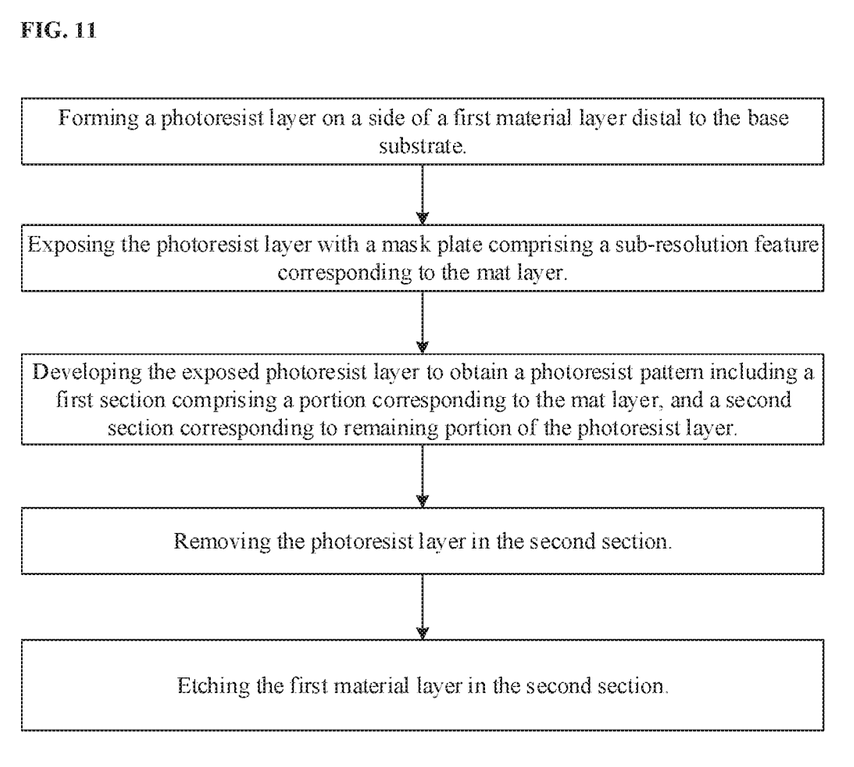
FIG. 11 is a flow chart illustrating a method of fabricating a mother substrate in some embodiments.

In another aspect, the present disclosure provides a method of fabricating a mother substrate. FIG. 11 is a flow chart illustrating a method of fabricating a mother substrate in some embodiments. Referring to FIG. 11, the method in the embodiment includes forming a photoresist layer on a side of a first material layer distal to the base substrate; exposing the photoresist layer with a mask plate. The first material layer may be a mat material layer on which the mat layer is to be formed. Optionally, the mat layer and the buffer layer are formed in a single process, e.g., a first material layer is a buffer/mat material layer on which the buffer layer and the mat layer are to be formed. The method further includes developing the exposed photoresist layer to obtain a photoresist pattern including a first section comprising a portion corresponding to the mat layer, and a second section corresponding to remaining portion of the photoresist layer. Optionally, when the mat layer and the buffer layer are to be formed in a single process, the first section corresponds to the buffer layer in combination with the mat layer. Optionally, the method further includes removing the photoresist layer in the second section; etching the first material layer in the second section; and removing the photoresist layer in the first section. In some embodiments, the mask plate includes an array of sub-masks. Optionally, the sub-mask has a resolution lower than the resolution of photoresist exposure unit/device. Alternatively, the first material layer may be exposed with a gray-tone mask plate or a half-tone mask plate, and the exposed first material layer may be developed to obtain a mat layer pattern.

Various shapes may be used for designing the sub-mask. Optionally, the sub-mask has a rectangular shape or round shape. The sub-mask includes a transmissive section and a light-shielding section. When a positive photoresist is used, the light-shielding section corresponds to the first section. When a negative photoresist is used, the transmissive section corresponds to the first section.

Due to the light scattering effect during the exposure and limited by the photoresist exposure resolution, a mat layer (e.g., the one shown in FIG. 2 or FIG. 6) can be formed. By having this mat layer, the segment difference between the first region (e.g., the array substrate unit region) and the second region (e.g., the cutting region) is effectively reduced. The extremely uneven distribution of the photoresist material and the extremely uneven surface in the first region proximal to the second region caused by a large segment difference can be eliminated or alleviated by the inclusion of the mat layer. Accordingly, the issues associated with subsequent exposure and development steps (e.g., affected photoresist coating and formation of critical dimension features) can also be avoided or improved.

Various embodiments may be practiced to fabricate the buffer layer and the mat layer. For example, the buffer layer and the mat layer may be fabricated in a single patterning process or two separate patterning processes. Optionally, the buffer layer and the mat layer is in a same layer. The buffer layer and the mat layer may be made of a same material. Optionally, the buffer layer and the mat layer are made of different material.

The mat layer and a mother substrate having the same may be combined with other materials and methods to further reduce photoresist surface undulation in subsequent array substrate unit fabrication. For example, in some processes, a photoresist material free of surfactant having a viscosity in the range of about 6 centipoise to about 7 centipoise is used. In some processes, the photoresist spinning speed is lower than 600 rpm. In some processes, the thickness of the photoresist layer is larger than 2.0 μm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a mother substrate having a first region and a second region, the mother substrate is formed to comprise a plurality of display substrate units in the first region;

the method comprising:
forming a buffer layer on and in contact with a base substrate in the first region, and forming a mat layer on and in contact with the base substrate in the second region for reducing segment difference between the first region and the second region;
wherein the buffer layer is formed in a display region of each of the plurality of display substrate units;
the buffer layer and the mat layer are made of an insulating material;
each of the plurality of display substrate units is formed to comprise one or more layers on a side of the buffer layer distal to the base substrate; and
a maximum thickness of the mat layer is h1, and the thickness of the buffer layer is h2, $h1 \leq h2$;
wherein forming the mat layer comprises forming an array of a plurality of mat units of non-uniform thicknesses;
wherein, subsequent to forming the mat layer, the method further comprises:
coating a photoresist material free of surfactant and having a viscosity in a range of about 6 centipoise to about 7 centipoise on a side of the buffer layer and the mat layer away from the base substrate; and
spinning the mother substrate to evenly distribute the photoresist material on the mother substrate at a spinning speed lower than 600 rpm;
wherein the photoresist material is coated to have a thickness greater than 2.0 μm.

2. The method of claim 1, wherein $0.6 \leq h1/h2 \leq 0.9$.

3. The method of claim 1, wherein the second region comprises a plurality of rows and a plurality of columns intersecting each other forming a plurality of intersection sections, the plurality of rows and the plurality of columns dividing the mother substrate into the plurality of display substrate units; the mat layer is formed within the plurality of intersection sections.

4. The method of claim 1, wherein the plurality of mat units have a substantially the same shape, and a trapezoidal cross-section along a plane perpendicular to the base substrate.

5. The method of claim 1, wherein a maximum thickness of the mat layer is h1, and the thickness of the buffer layer is h2, $h1=h2$, the mat layer abuts a side plane of the buffer layer at the interface between the first region and the second region, the mat layer has a right triangular cross-section along a plane perpendicular to the base substrate.

6. The method of claim 5, wherein the mat layer comprises a bottom plane in contact with the base substrate and an inclined side plane facing away a side plane of the buffer layer, the inclined side plane and the bottom plane defines an angle α, and $20° \leq α \leq 60°$.

7. The method of claim 1, wherein forming the mat layer comprises patterning a first material layer;

wherein patterning the first material layer comprises:
forming a photoresist layer on a side of the first material layer distal to the base substrate;
exposing the photoresist layer with a mask plate comprising a sub-resolution feature corresponding to the mat layer;
developing the exposed photoresist layer to obtain a photoresist pattern including a first section comprising a portion corresponding to the mat layer, and a second section corresponding to remaining portion of the photoresist layer;
removing the photoresist layer in the second section; and
etching the first material layer in the second section.

8. The method of claim 7, wherein the buffer layer and the mat layer are made of a same insulating material and patterned in a single patterning process.

9. A display substrate having a display region and a peripheral region fabricated by cutting the mother substrate formed according to the method of claim 1, comprising:
a second buffer layer on and in contact with a second base substrate in the display region; and
a second mat layer on and in contact with the second base substrate in the peripheral region;
wherein the second buffer layer and the second mat layer are made of an insulating material;
the display substrate comprises one or more layers on a side of the second buffer layer distal to the second base substrate; and
a maximum thickness of the second mat layer is h1, and the thickness of the second buffer layer is h2, $h1 \leq h2$.

10. The display substrate of claim 9, wherein the second buffer layer and the second mat layer are made of a same insulating material.

11. The display substrate of claim 10, wherein $0.6 \leq h1/h2 \leq 0.9$.

12. The display substrate of claim 9, wherein the second mat layer is within one or more corner portions of the peripheral region.

13. The display substrate of claim 9, wherein the second mat layer comprises an array of a plurality of second mat units.

14. The display substrate of claim 13, wherein the plurality of second mat units have a substantially the same shape, and a trapezoidal cross-section along a plane perpendicular to the base substrate.

15. The display substrate of claim 9, wherein a maximum thickness of the second mat layer is h1, and the thickness of the buffer layer is h2, $h1=h2$, the second mat layer abuts a side plane of the second buffer layer at the interface between the display region and the peripheral region, the second mat layer has a right triangular cross-section along a plane perpendicular to the second base substrate.

16. The display substrate of claim 9, wherein the second mat layer comprises a bottom plane and an inclined side plane distal to a side plane of the second buffer layer, the inclined side plane and the bottom plane defines an angle α, and $20° \leq α \leq 60°$.

17. A display panel comprising a display substrate of claim 9.

* * * * *